July 6, 1965 G. B. STRACCA 3,193,776

NEGATIVE RESISTANCE AMPLIFIER CIRCUIT INCLUDING SPURIOUS OSCILLATION SUPPRESSION MEANS

Filed July 25, 1962 2 Sheets-Sheet 1

INVENTOR.
Giovanni B. Stracca

BY C. A. Galbrandsen

Atty.

INVENTOR.
Giovanni B. Stracca
BY
C. A. Gulbrandsen
Atty.

United States Patent Office 3,193,776
Patented July 6, 1965

3,193,776

NEGATIVE RESISTANCE AMPLIFIER CIRCUIT INCLUDING SPURIOUS OSCILLATION SUPPRESSION MEANS

Giovanni Battista Stracca, Milan, Italy, assignor to Marelli Lenkurt S.p.A., Milan, Italy
Filed July 25, 1962, Ser. No. 212,289
Claims priority, application Italy, Aug. 11, 1961, 14,968/61
1 Claim. (Cl. 330—61)

Figure 1:
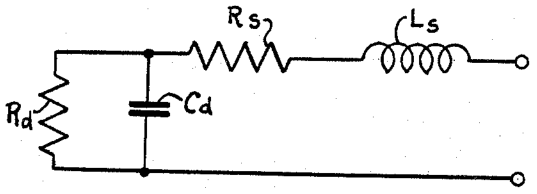

The present invention relates to microwave amplifiers employing tunnel diodes, and more particularly to amplifiers utilizing the negative differential resistance of these diodes.

The use of tunnel effect diodes in microwave amplifiers presents notable practical difficulties, and above all, that of succeeding in biasing the diode in a stable manner at any predetermined point in the zone of its negatively sloped voltage-current characteristic.

In the copending U.S. patent application Serial No. 196,753, filed on May 22, 1962, which is also in the name of the present applicant, there is described and claimed a tunnel diode amplifier which permits the avoidance of this difficulty. To this end, as described, a terminating circuit for the tunnel diode is provided which presents a constant resistance for all frequencies below the cut off frequency of the diode, including direct current, so as to be able to apply to the diode both the D.C. bias voltage and the signal to be amplified.

The utility of providing a circuit which presents a constant and resistive impedance to the terminals connected to the tunnel diode, at all frequencies, derives from the fact that it can be demonstrated that there are ranges of value for this resistance which are a function of the circuit parameters of the tunnel diode, wherein no phenomena of instability of any kind can occur. This eliminates the formation of spurious oscillations at all frequencies, which in the case of an amplifier circuit would among other things, lower the amount of power gain at the desired frequency.

With this solution, to obtain a sufficiently high ratio of amplification, the value of this resistance must be very close to the limit of the zone of the possible values which permit conditions of stable operation. Consequently, the small variatons of characteristics existing from sample to sample of the diode, are sufficient to carry the amplifier to a condition of instability, or at least, to wide variations of amplification.

On the other hand, since this terminating resistance must be such as to have the same value for a very wide band of frequencies, which extends from direct current to the cut off frequency of the diode, its regulation is neither easy nor simple.

This invention proposes to provide a circuit for an amplifier, which presents to the terminals connected to the diode a first resistance $R_1$ for a small band of frequencies, corresponding to that of the signal to be amplified, and a second constant resistance $R_2$ for all of the remaining frequencies included between the cut off frequency of the diode and direct current. The first resistance $R_1$ is of a value such as to provide the desired amplification, and it can be easily regulated, inasmuch as its value is to be obtained only over a restricted frequency band. The second resistance $R_2$ is of a value sufficiently far from the limit of the zone of instability to ensure this instability against any variation, fortuititous or otherwise, in the characteristics of the diode, and also with different samples of diodes.

If the tunnel diode is represented by a schematic equivalent circuit constituted of a differential resistance $R_d$, function of the voltage, which becomes negative during an appropriate zone of bias; of a capacitance $C_d$ in parallel with the said resistance and likewise a function of the voltage; of a resistance $R_s$ due to the limited conductivity of the "diode wafer"; and of an inductance $L_s$ which takes into account the inductance of the container (these last two being in series with each other and in parallel with $D_d$ and $C_d$), it can be demonstrated that, by terminating this equivalent circuit on a constant resistance $R_2$, in order not to have any phenomena of instability, $R_2$ should be such that $R_2+R_s$ will always be included between:

$$|R_d|>R_2+R_s>\frac{L_s}{C_d|R_d|} \qquad \text{(I)}$$

In practice, this is still true, even if within the amplifier's operating frequency band, provision is made for transforming the value of $R_2+R_s$ into a somewhat smaller value so as to obtain the desired value A of the power amplification:

$$R_1=\left(\frac{|R_d|}{1+\omega^2 C_d^2 R_d^2}-R_s\right)\frac{\sqrt{A}+1}{\sqrt{A}-1} \qquad \text{(II)}$$

It is therefore possible to make $R_2$ sufficiently greater than $R_1$ to ensure the stability of the amplifier, even for thermal variations in the characteristics of the diode, or substitutions of one sample of diode for another.

One possible realization of the invention consists in inserting the tunnel diode as a termination for a transmission line in which, for all of the frequencies below the cut off frequency of the diode, only the principal or TEM mode may be propagated (for example, a coaxial line or a shielded strip line), and whose characteristic impedance is selected so as to satisfy the relation (I). The said transmission line must be terminated at the other end on its characteristic impedance for all of the frequencies, and in such a way as to be able to apply the bias voltage to the central conductor of the transmission line, and consequently to the tunnel diode.

Finally, a circuit resonant at the frequency of the signal to be amplified is inserted in the said transmission line, at a suitable distance from the said tunnel diode, so as to establish with the said diode and the section of line included between the said resonator and the diode, a distributed-constant resonator, resonating at the frequency of the signal. The source of the signal to be amplified is coupled to the resonant section of line in such a manner as to transfer the source's equivalent resistance to the diode terminals only in the operating frequency band, as load resistance with the value $R_1$. This allows the desired power amplification A to be obtained under stable circuit conditions.

Figure 2:
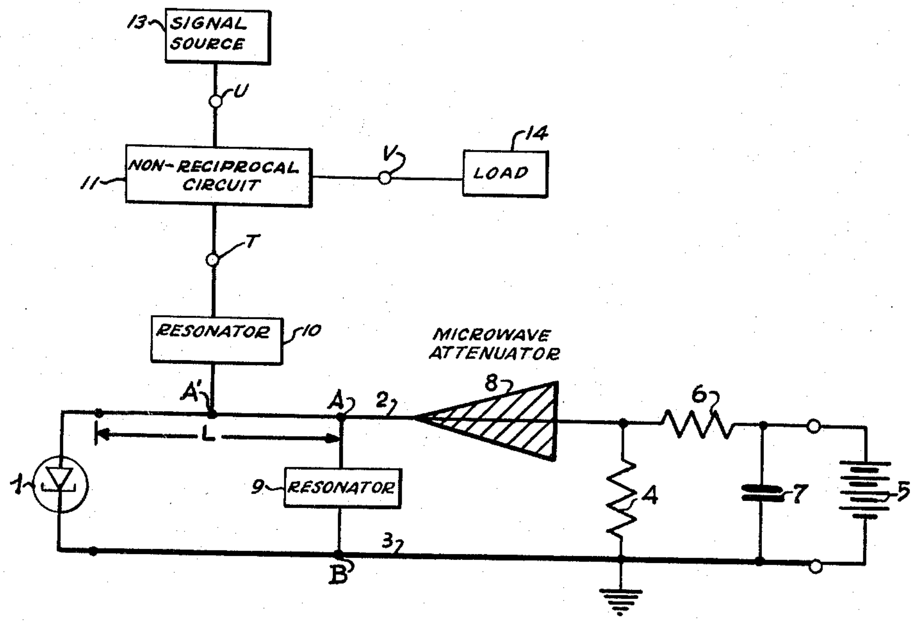
Figure 3:
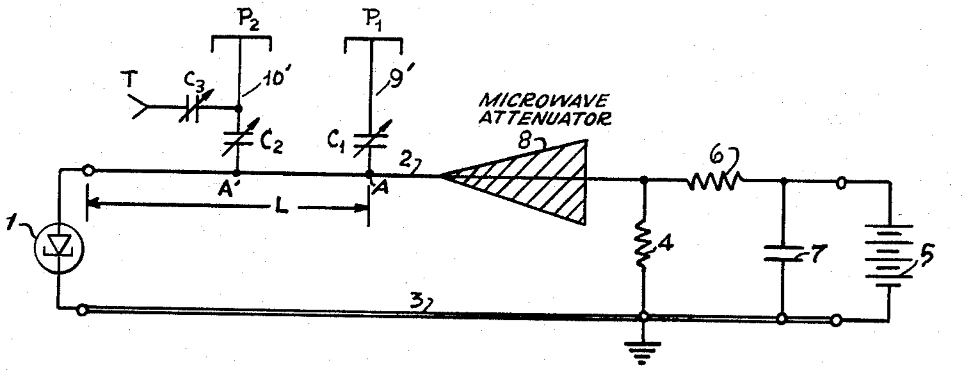
Figure 4:
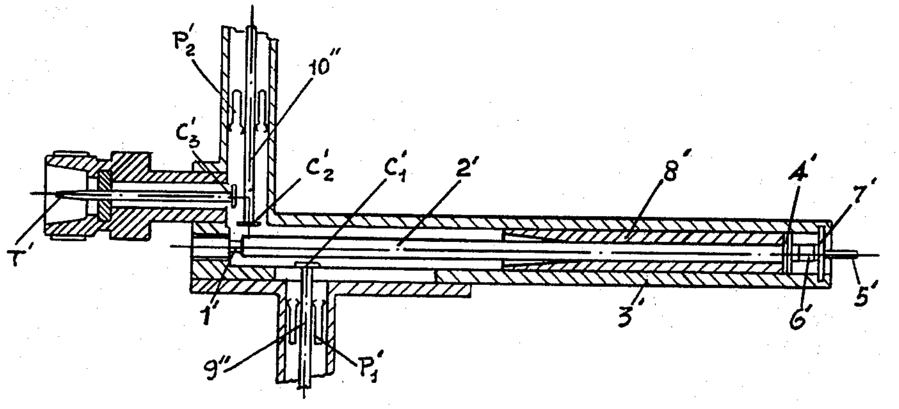

The invention will be described, by way of example only, with reference to the appended drawings, in which:

The FIGURE 1 shows the schematic equivalent circuit of a tunnel diode;

The FIGURE 2 represents, in schematic form, a tunnel diode microwave amplifier formed of a particular transmission line, to which two resonators are connected in appropriate manner;

The FIGURE 3 shows an example of construction, again in schematic form, of the amplifier of the FIGURE 2, in which the resonators are arranged in a particular manner;

The FIGURE 4 shows a constructional realization of the amplifier shown in the FIGURE 3.

In the FIGURE 1, which shows the schematic of the electrical equivalent of a tunnel diode, $R_d$ represents the differential resistance, $C_d$ represents the capacitance of the tunnel diode, $R_s$ the series resistance of the diode wafer, and $L_s$ the inductance of the diode container.

With reference to the FIGURE 2, the tunnel diode 1 is connected as a termination for a transmission line in which may be propagated, for all frequencies below the cut off frequency of the diode, only the principal or TEM mode (for example, a coaxial line or a shielded strip line), whose characteristic impedance is selected so as to satisfy the required conditions of stabilization. The said line, of which the central conductor and the external shielding conductor (ground) are indicated by 2 and 3 respectively, is terminated, at the end opposite that to which the tunnel diode 1 is connected, by a terminating resistance 4 whose value is equal to the characteristic impedance of the line. In order to be able to apply the bias voltage to the diode, the source 5 of this voltage is connected to the central conductor 2 of the transmission line, through a resistance 6 connected on one side to the source 5, and on the other to the central conductor 2 of the said line and to the closing resistance 4. The value of the resistance 6 should be sufficiently high with respect to the value of the resistance 4 so as practically not to alter the overall value of the terminating resistance of the transmission line.

A by-pass and protective condenser 7 is also connected between the grounded conductor 3 and the resistance 6, in correspondence with the terminal connected to the source 5 of the bias voltage. A microwave attenuator 8 is inserted in the conductor 2 of the transmission line ahead of the resistance 4, so as to ensure that even at the highest frequencies the line will be terminated on its characteristic impedance.

This transmission line, together with the attenuator and the terminal resistance permits the actualization of the resistance of value $R_2$ to be presented to the diode for ensuring the stability of the amplifier (see Formula I).

In order to obtain, at the frequency of the signal to be amplified, the value of the resistance $R_1$ which ensures the desired amplification, two resonators are provided for appropriate insertion in the transmission line.

A first resonator 9, resonant at the signal frequency, is inserted on the conductor 2 of the said line at a point A which is at a distance L from the tunnel diode 1, and ahead of the attenuator 8, to establish at the said frequency a short-circuit between the central conductor 2 and the external conductor 3. If the distance L between the said point and the tunnel diode is selected in an appropriate manner, this section of line, together with the said diode 1 and the said resonator 9, will constitute a resonator resonant at the frequency of the signal to be amplified. At the said frequency, the electrical short circuit thus established between A and B excludes the attenuator, resistances, et cetera.

A second resonator 10, also resonant at the signal frequency, is coupled both to the said transmission line, at a point A′ of the conductor 2 as close as possible to the diode 1, and to the signal source, for the purpose of coupling the signal to be amplified to the diode, and in such a way as to present the desired load resistance $R_1$ to the terminals of the said diode. This type of coupling has the advantage of being easy to achieve and to regulate, in order to change the value of the gain and compensate for the variation of the characteristics from one diode to another.

The symbol T indicates the terminal of the resonator 10 to be connected to the signal generator 13 and to the operating load 14, through an appropriate non-reciprocal circuit 11. In FIGURE 2 the non-reciprocal circuit is coupled to terminal T, and to the source 13 and load 14 at terminals U and V respectively.

In the operation of the system as shown in FIG. 2 for frequencies within the operating band, an input signal from source 13 is coupled by the non-reciprocal circuit 11 and the resonator 10 to A′, which is immediately adjacent to tunnel diode 1. The resonator 10 presents the source 13 and the load 14 as an optimum resistance, $R_1$, to obtain maximum power amplification.

A resonant section of line, L, is formed by resonator 9, line L, and the parameters $L_s$ and $C_d$ of diode 1, thus allowing the diode 1 to appear as a negative resistance at its terminals. The signal from source 13 presented to diode 1 at A′ is then reflected back with increased amplitude to resonator 10 through non-reciprocal circuit 11, to load 14. An amplification in the reflected signal is obtained, since as is well known, the negative resistance due to the tunnel diode at A′ delivers power to the coupled load 14.

In the schematic of the FIGURE 3, the resonators 9 and 10 of the FIGURE 2 are formed respectively of the line sections 9′ and 10′, both short circuited at one end, and at the other, coupled capacitively to the transmission line 2. Both the short circuits $P_1$ and $P_2$, as well as the condensers $C_1$ and $C_2$, are made adjustable. The line section 10′ is also coupled capacitively ($C_3$) with the signal source and the load, through the above mentioned non-reciprocal circuit.

A constructional embodiment of the circuit schematic of the FIGURE 3 is shown in the FIGURE 4, in which the corresponding parts are indicated by the same symbols equipped with prime marks. In this figure, the tunnel diode 1′ is connected, as a termination, to a coaxial line 2′–3′ terminated at its other end by a disk resistance 4′. The resistance 6′ is connected at one end to this resistance and to the central conductor 2′, and to ground for the high frequencies through a by-pass condenser 7′, at the other end. The microwave attenuator 8′ is formed of a lossy material inserted between the internal conductor 2′ and the external conductor 3′ of the coaxial line, between the tunnel diode and the terminating resistance 4′. This is tapered in ways well known to those skilled in the art, with the object of presenting a very small coefficient of reflection at the frequencies for which it is effective. At an appropriate point of the said transmission line, between the tunnel diode and the attenuator, is inserted the current resonator 9″, made of a section of coaxial line, short circuited at one end, and coupled by a condenser $C'_1$ to the central conductor 2′ of the transmission line. The length of the said resonator may be regulated by displacing the terminal short-circuit $P'_1$ in such a way as to be able to regulate the frequency of operation. The second resonator 10″ is also constituted of a section of coaxial line short circuited at one end and of appropriate length, coupled by the condenser $C'_2$ to the conductor 2′ in proximity to the diode, the said resonator being coupled in its turn by another condenser $C'_3$ to a coaxial line connector T′, which constitutes the input terminal of the amplifier. The short circuit $P'_2$ for this second resonator 10″ may also be displaced, for regulating the length, and thus being able to vary the operating frequency.

The condensers $C'_2$ and $C'_3$ are adjustable in order that the value of the load resistance transferred to the tunnel diode terminals and consequently the amplifier gain may be varied.

The invention has been described with reference to a particular embodiment. It is clear however, that what has been described has the value of an example only, and not of a limitation, with respect to all of the possible forms of construction coming within the range and scope of the invention.

What is claimed is:

In a microwave system comprising a source of signals to be amplified over an operating band of frequencies, and a load coupled to said source, a negative resistance amplifier circuit including a transmission line coupled to said source and said load having at one end thereof a negative resistance device, and at the other end thereof means for biasing said device in its negative resistance region and for terminating said transmission line in its characteristic impedance for all frequencies outside of said operating band so as to insure circuit stability, and resonant means coupled to said transmission line, said resonant means including a tuner providing for frequencies within said operating band, a relatively low impedance across said transmission line between said device and said terminating means, and coupled to said transmission line at such a distance from said device as to establish a resonant section of transmission line therebetween, and said tuner means further including a section of a second transmission line short-circuited at one end and coupled capacitively to said first transmission line at the other end, and means for adjusting the position of said short-circuit and the amount of said coupled capacitance, the combination of said resonant means and said source and load presenting to said negative resistance device a substantially optimum terminating resistance over said operating band of frequencies so as to obtain substantially maximum stable power gain from said circuit.

References Cited by the Examiner

UNITED STATES PATENTS

| | | | |
|---|---|---|---|
| 3,040,267 | 6/62 | Seidel. | |
| 3,080,530 | 3/63 | Smith | 330—34 X |
| 3,112,454 | 11/63 | Steinhoff | 330—34 X |
| 3,116,459 | 12/63 | Tiemann. | |

ROY LAKE, *Primary Examiner*.

NATHAN KAUFMAN, *Examiner*.